7/8/80 XR 4,211,949

United States Patent [19]

Brisken et al.

[11] 4,211,949

[45] Jul. 8, 1980

[54] WEAR PLATE FOR PIEZOELECTRIC ULTRASONIC TRANSDUCER ARRAYS

[75] Inventors: Axel F. Brisken, Ballston Lake; Lowell S. Smith, Schenectady, both of N.Y.

[73] Assignee: General Electric Company, Schenectady, N.Y.

[21] Appl. No.: 958,655

[22] Filed: Nov. 8, 1978

[51] Int. Cl.[2] .............................................. H01L 41/10

[52] U.S. Cl. ...................................... 310/322; 73/642; 73/644; 128/660; 128/663; 310/334; 310/335; 310/336

[58] Field of Search ........ 310/322, 323, 326, 334–337; 73/570, 587, 603, 605, 625, 627–629, 632, 642, 644; 128/660, 663

[56] References Cited

U.S. PATENT DOCUMENTS

| | | | |
|---|---|---|---|
| 2,527,217 | 10/1950 | Hayes | 340/8 MM |
| 3,277,451 | 10/1966 | Parssinen | 340/8 MM |
| 3,409,869 | 11/1968 | McCool et al. | 340/8 MM |
| 3,457,543 | 7/1969 | Akervold et al. | 340/10 |
| 3,622,825 | 11/1971 | Bennett | 340/10 X |
| 3,657,181 | 4/1972 | Riedesel et al. | 340/8 MM X |
| 3,854,060 | 12/1974 | Cook | 310/337 X |
| 4,101,795 | 7/1978 | Fukumoto et al. | 310/336 |

*Primary Examiner*—Mark O. Budd
*Attorney, Agent, or Firm*—Donald R. Campbell; James C. Davis; Marvin Snyder

[57] ABSTRACT

A linear transducer array for 90° or other wide angle sector scans is covered by a body contacting wear plate made of a material such as filled silicone rubber or polyurethane epoxy in which the longitudinal sound velocity is equal to or less than that in the body and in which the acoustic impedance for longitudinal sound waves is approximately equal to that of the body. Refraction, if it occurs, enhances the field of view without reducing the transmission of acoustic energy. The wear plate provides mechanical support for a fragile front surface matched array.

2 Claims, 6 Drawing Figures

WEAR PLATE FOR PIEZOELECTRIC ULTRASONIC TRANSDUCER ARRAYS

RELATED APPLICATION

This application is related to Ser. No. 958,654, "Front Surface Matched Ultrasonic Transducer Array", filed concurrently by the present inventors and assigned to the same assignee.

BACKGROUND OF THE INVENTION

This invention relates to ultrasonic probes for diagnostic examinations and especially to a wear plate at the front surface of the transducer array which contacts the human body. This probe also can be used for water tank testing.

All transducer arrays in medical ultrasound instruments need a smooth continuous surface for body contact. The array itself is rough because of the slots between individual elements and a smooth covering is required. Furthermore, since some arrays represent a fragile architecture, a stabilizing material preventing damage at nominal body contacting pressures must be placed on the front surface.

Many commercial ultrasonic probes have wear plates with undesirable acoustic properties. An epoxy-like material has been used as an acoustic impedance matching layer and as a wear plate, and while this material is extremely rugged and mechanically strong, the high velocity of sound in the epoxy and its continuous surface result in refraction of acoustic waves away from the transducer elements. This results in a severely restricted field-of-view for the individual elements as shown in dashed lines in FIG. 6.

The requirement of an improved array covering is essential in a steered beam imager with a wide scan angle of about 60° to 90° using an array of narrow elements having a width on the order of one wavelength or less at the ultrasound emission frequency. Assuming that the beam is steered at a maximum angle of 45° from a normal at the center of the array, refraction of acoustic waves in the wrong direction during reception or transmission cannot be tolerated and leads to degraded performance.

SUMMARY OF THE INVENTION

A wear plate at the front surface of a medical transducer array of narrow elements for wide angle sector scans is made of a material in which the longitudinal velocity of sound is equal to or less than the longitudinal sound velocity in the human body, and in which the acoustic impedance for longitudinal acoustic waves is approximately equal to that of the body. The first property assures that the refraction of received echoes does not direct the acoustic beam away from the normal; on transmission, the acoustic beam is refracted away from the normal for a wider field-of-view. The second property makes the wear plate appear as part of the body so that there is maximum transmission of ultrasound and no change in the pulse shape of the transducer waveform. A third property is that it exhibits sufficient mechanical strength to prevent damage to the array structure at nominal body contact. Materials satisfying all three requirements are room temperature vulcanizing filled silicone rubber and polyurethane epoxy.

The preferred embodiment is a front surface matched linear transducer array comprised of elements with a width on the order of one wavelength or less at the emission frequency, capable of performing 90° sector scans. The elements and associated impedance matching layers are cut all the way through thus preventing refraction of acoustic energy away from the normal, as experienced in prior art transducers with continuous matching layers as sketched in FIG. 3. The wear plate is attached to the cut through impedance matching layers and supports the fragile array assembly.

Because the longitudinal sound velocity and acoustic impedance of water are equal to or approximately equal to those of the human body, the same principles are valid for wear plates and arrays for water tank testing.

DESCRIPTION OF THE PREFERRED EMBODIMENTS

Figure 1:
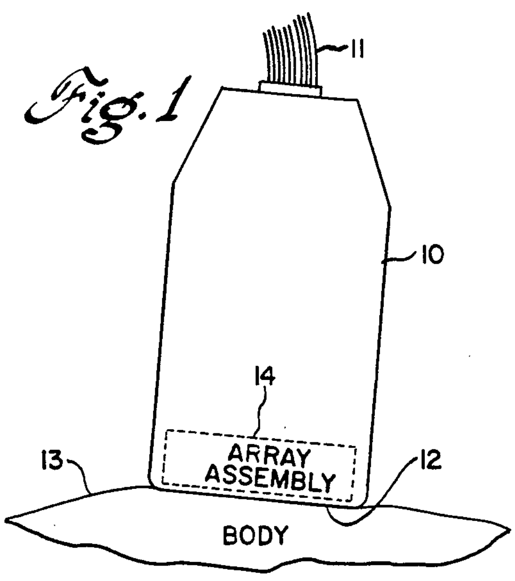
FIG. 1 is a side view of the ultrasonic probe depicting the wear plate over the transducer array which is pressed against the body.

In FIG. 1, ultrasonic probe 10 is held in the hand by a physician making a medical diagnostic examination and is connected by cables 11 to the remainder of a real time steered beam imaging system. Wear plate 12 covers the front surface of the probe and is directly in contact with the skin over the area of a patients's body 13 under investigation, and the probe is freely moved about while observing the image on a cathode ray tube to locate the body structure of interest and realize the best image. It is standard practice during ultrasonic examinations to place a coating of a gel between the wear plate and patient in order to assure good acoustic coupling by excluding air pockets. The wear plate is a continuous covering for the several individual transducer elements of array assembly 14, which is shown in greater detail in FIG. 4.

Steered beam imagers are also known as sector scanners, and this invention is concerned with unique wear plate materials for realizing wide angle sector scans with a total scan angle exceeding about 60° using a transducer array with narrow elements having a width on the order of one wavelength or less of the ultrasound emission frequency. One essential property of the wear plate material is that its longitudinal sound velocity ($V_L$) is less than or equal to that in the human body, i.e., $V_L \leqq 1.5 \times 10^5$ cm/sec. This constraint shows that refraction, if it does occur, will actually enhance the field-of-view of individual transducer elements. A second essential property is that its acoustic impedance for longitudinal acoustic waves is approximately equal to that of the human body, i.e., approximately $1.54 \times 10^5$ g/cm$^2$-sec. By satisfying this condition, the wear plate does not change the pulse shape of the transducer waveform and there is a maximum transmission of acoustic energy. Indeed, the wear plate is thus seen acoustically as part of the human body. A third property, essential for many applications, is that the material exhibits sufficient mechanical strength to prevent damage to the array structure at nominal body contact. Before proceeding further, the principles of phased array steered beam systems are reviewed.

Figure 2:
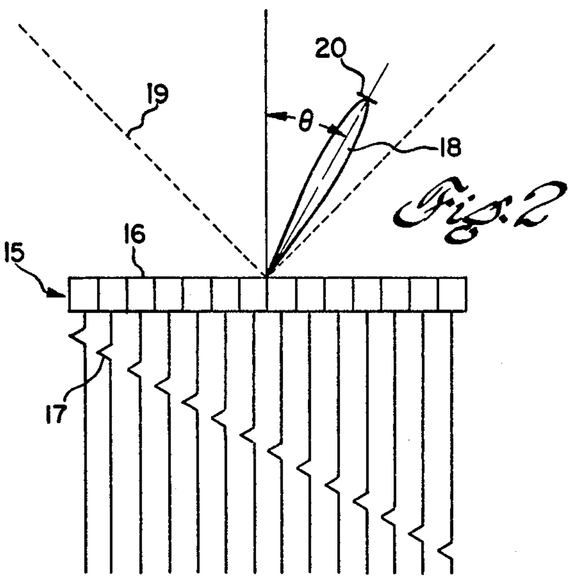
FIG. 2 is a sketch of a linear array with signals to and from each element delayed appropriately to provide a steered beam.

Referring to FIG. 2, linear transducer array 15 is comprised of a large number of piezoelectric transducer elements 16 which are energized by excitation pulses 17 in a linear time sequence to form an ultrasound beam 18 and direct the beam in a preselected azimuth direction to transmit a pulse of ultrasound. In order to steer the beam electronically to an angle $\theta$ degrees from the normal to the array longitudinal axis at the sector origin point, a time delay increment is added successively to each signal as one moves down the array from one end to the other to exactly compensate for the propagation path time delay differences that exist under plane wave (Fraunhofer) conditions. First order corrections to the time delays will allow the system to also operate in the near field (Fresnel). By progressively changing the time delay between successive excitation pulses, the angle on one side of the normal is changed by increments, and to form an acoustic beam at the other side of the normal, the timing of excitation pulses 17 is reversed so that the right hand transducer is energized first and the left hand transducer is energized last. The total sector scan angle indicated by dashed lines 19 is approximately 90°. Echoes returning from targets 20 such as body structures in the direction of the transmitted beam arrive at the transducer elements at different times necessitating relative delaying of the received echo signals by different amounts so that all the signals from a given point target are summed simultaneously by all elements of the array. The time delays of the individual echo signals are the same as during transmission to compensate for acoustic path propagation delay differences, and these are referred to as steering delays. Every receiving channel may also electronically and dynamically focus a received echo to compensate for the propagation path time delay differences from the focal point to the varying individual array element positions. The contributions from all receive elements are coherently summed and the focused echo signals are fed to a cathode ray tube or other display device where the sector-shaped image is built up scan line by scan line as echo information is received.

Figure 4:
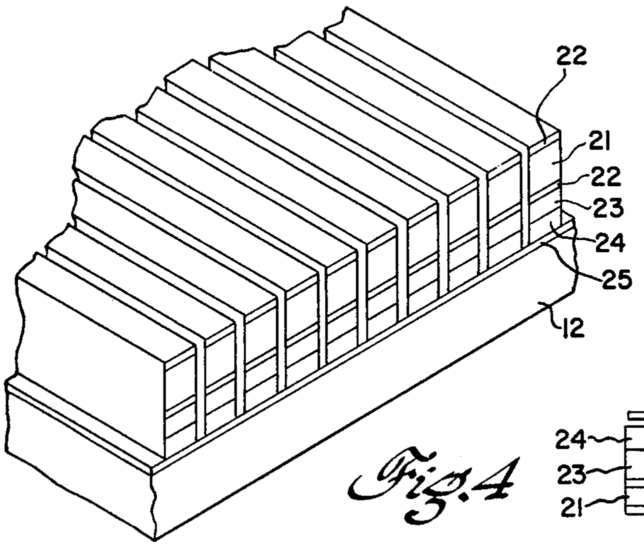
FIG. 4 is a fragmentary perspective view of the array assembly and wear plate according to the invention.

The preferred transducer array is a front surface matched array with a large field of view, and its assembly to the wear plate is illustrated in FIG. 4. The piezoelectric ceramic transducer elements are fully or substantially isolated from one another by the complete through cutting of the front surface impedance matching layers and the ceramic. Each piezoelectric element 21 has a metallic coating 22 on opposite faces to serve as electrodes and has a width in the direction of the longitudinal axis of the array on the order of one wavelength or less at the ultrasound emission frequency. The thickness between metallic coatings is one-half wavelength; the element acts essentially as a half wave resonator. Impedance matching layers 23 and 24 each have a thickness of one-quarter wavelength and serve as acoustic quarter wave matching transformers. Layer 23 is made of Pyrex ® or other glass and layer 24 is made of Plexiglas ® or other plastic. Reference may be made to application Ser. No. 958,654 for further information on the front surface matched transducer array. This array configuration has a fragile architecture and it is necessary that the wear plate be sufficiently thick and have enough mechanical strength to prevent damage to the array during an ultrasound examination.

Wear plate 12 can be many wavelengths thick, has minimum acoustic absorption, and is conveniently cast onto the front surface of the transducer array as a viscous liquid which cures in several hours to a solid. It is useful to place a thin layer (typically 0.00025 in. thick) of Mylar ® tape 25, which is a film of polyethylene terephthalate resin, between the array and wear plate material so that liquid does not infiltrate the slots between the elements. The Mylar tape surface is primed so that the wear plate resin adheres easily to it. Two materials possessing the three properties previously outlined as to longitudinal sound velocity, acoustic impedance, and mechanical strength are filled silicone rubber and polyurethane epoxy. A filled silicone rubber meeting the specifications of this application (many are unacceptable) is sold by the General Electric Company with the designation RTV-28. A particular polyurethane epoxy that is suitable is sold by Emerson & Cuming, Inc., with the designation STY CAST ® CPC-19 Room Temperature Curing Polyurethane. Both materials are cast as viscous solids and are room temperature curing compounds. There may be other materials that fill all the requirements but the selection is believed to be limited. Known materials possessing the specified acoustic properties can be described as being rubbery.

Figure 5:
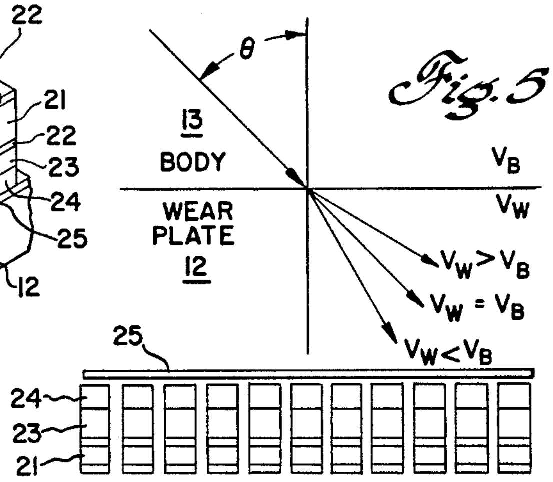
FIG. 5 shows the body-wear plate interface and the paths of acoustic waves for the several conditions concerning the velocity of sound.

The requirement that the longitudinal sound velocity in the wear plate material ($v_W$) is approximately the same as or less than that in the body ($v_B$) is clarified in FIG. 5. An incident acoustic wave at an angle $\theta$ from the normal assumed to be 45° is transmitted in the wear plate without deviation when the two values of longitudinal sound velocity are identical. If the velocity in the wear plate is much greater than the velocity in the body, the refracted wave is at an angle greater than 45° and propagates through the wear plate in a direction away from the transducer elements, restricting the field of view. Indeed, the incident acoustic beam may be totally reflected and not even refracted if the velocity is too high, even for incident angles less than 45°. When the velocity in the wear plate is less than the velocity in the body, the refracted wave is bent toward the array normal and is detected by the elements. The radiation pattern of a single element is such that an acoustic wave at a relatively flat angle may be incident at a side lobe or zero of the pattern, while at an angle closer to the normal it is in the main lobe area.

The requirement that the acoustic impedance of the wear plate ($Z_2$) is approximately equal to that of the body ($Z_1$) is based on the reflection amplitude for acoustic energy, given as $R=Z_2-Z_1/Z_2+Z_1$. If the two values of acoustic impedance are identical, the wear plate then appears as part of the body and there is no reflection at the body-wear plate interface. The wear plate then does not change the pulse shape of the transducer waveform. If the acoustic impedances are unequal, the wear plate-body interface will become the source for reflections of acoustic energy. These reflections may destructively interfere with the existing transducer acoustic waveform in a manner to decrease the effective sensitivity (amplitude) and to increase the impluse response duration, both undesirable variations.

Figure 3:
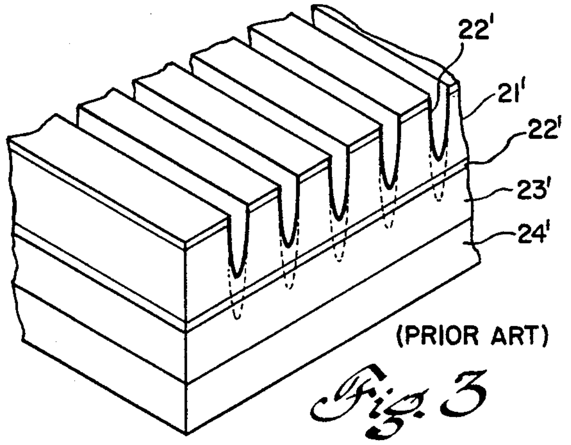
FIG. 3 is a sketch of a prior art linear array with a limited field-of-view.
Figure 6:
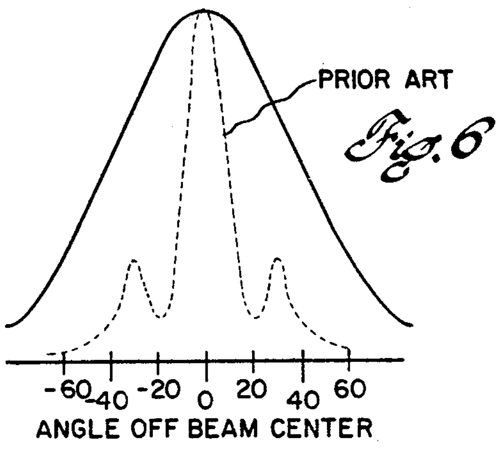
FIG. 6 is a plot of acoustic amplitude vs. angle off the normal contrasted with a dashed prior art curve for a high sound velocity wear plate material.

The solid covering on the transducer array does not adversely affect the field of view as is demonstrated by the curve in FIG. 6 of amplitude vs. angle off beam center for a typical array. There is an excellent waveform throughout and although the amplitude drops as the scan angle increases, the integrity of the elemental waveform is maintained. In interpreting this curve, it should be realized that the array elements themselves are diffraction slits and the limiting theoretical curve is defined by diffraction theory. The dashed line prior art curve is for a linear transducer array having a high sound velocity wear plate. There is an excellent waveform at narrow scan angles. The secondary peaks are caused by resonance (acoustic energy refracted parallel to the array surface) and the valleys on either side are due to the destructive summation of the multitude of refracted and reflected waves in the solid (uncut) front surface matching layers. It may be added before concluding that the front surface matched transducer array in FIG. 4 has a broad field of view. With a narrow element width at the front of the array of one wavelength or less, an incoming acoustic wave at any incident angle appears as a local variation in hydrostatic pressure and a subsequent acosutic wave propagates down the impedance matching "wave guide" 24, 23 into piezoelectric ceramic 21. There is insufficient width for the wave phenomena of refraction to occur. The small element width thus radiates and receives acoustic energy to first order according to diffraction theory. Employing a wear plate material of the type discussed here on the prior array of FIG. 3 will not improve the field-of-view as the large width of the front matching layers is the seat for refraction. The narrow array elements cut through the matching layers and break up this refraction possibility.

Cross-referenced application Ser. No. 958,654 has a discussion of FIG. 3 and a brief summary will suffice. Impedance matching layers 23' and 24' have thicknesses of one-quarter wavelength and are quarter wave transformers, but these layers are continuous and acoustic energy at angles greater than approximately 20° from the normal is refracted away from the ceramic. Only the array elements 21' are isolated by cutting partially through the ceramic slab or completely through (dashed lines). Numeral 22' designates the electrodes.

The longitudinal sound velocity in water is equal to or approximately equal to that in the body and the acoustic impedance of water is equal to or approximately equal to that of the body. Thus, wear plates and arrays suitable for medical diagnostics may also be used for water tank testing and examination of objects, or the wear plate material can be selected by the same criteria to match the numeric values for water (the acoustic impedance is $1.50\times 10^5$ g/cm$^2$-sec).

While the invention has been particularly shown and described with reference to a preferred embodiment thereof, it will be understood by those skilled in the art that various changes in form and details may be made therein without departing from the spirit and scope of the invention.

The invention claimed is:

1. A medical ultrasonic probe for use in a steered beam imaging system comprising:

a front surface matched linear transducer array comprised of narrow piezoelectric transducer elements to each of which is secured at least one quarter-wavelength impedance matching layer, every element and its associated matching layer having a width in the direction of the longitudinal axis of the array on the order of one wavelength or less at the ultrasonic emission frequency, said elements and associated matching layers being substantially acoustically isolated from one another;

said transducer array transmitting acoustic pulses along many radial scan lines to perform a wide angle sector scan with a total angle exceeding 60° and detecting echoes reflected by body structures;

a continuous wear plate attached to said impedance matching layers and giving mechanical support to said transducer array, said wear plate contacting the human body during an ultrasound examination and consisting of a material in which the longitudinal sound velocity is equal to or less than that in the human body and in which the acoustic impedance for longitudinal acoustic waves is approximately equal to that of the human body, whereby any refraction of acoustic waves that occurs enhances the field-of-view of said transducer elements.

2. The ultrasonic probe of claim 1 wherein said wear plate material is selected from the group consisting of room temperature vulcanizing filled silicone rubber and room temperature curing polyurethane epoxy.

* * * * *